United States Patent [19]

Craft

[11] 4,220,974
[45] Sep. 2, 1980

[54] AFT CIRCUIT

[75] Inventor: Jack Craft, Bridgewater, N.J.

[73] Assignee: RCA Corporation, New York, N.Y.

[21] Appl. No.: 955,515

[22] Filed: Oct. 30, 1978

[51] Int. Cl.² .................... H04N 5/50; H03K 5/20; H04B 1/16
[52] U.S. Cl. ..................... 358/195.1; 307/233 R; 455/263
[58] Field of Search ............... 358/195, 23, 188; 325/418–423; 331/1 R, 10, 11, 20; 307/233 R, 295, 362; 329/103, 110, 129; 330/307

[56] References Cited

U.S. PATENT DOCUMENTS

| 3,577,008 | 5/1971 | Craft | 307/233 R |
| 3,842,198 | 10/1974 | Martin | 358/195 X |
| 3,968,325 | 7/1976 | Beriere | 358/195 |

FOREIGN PATENT DOCUMENTS

| 699965 | 4/1952 | United Kingdom . |
| 762770 | 12/1956 | United Kingdom . |
| 896688 | 5/1962 | United Kingdom . |
| 916160 | 1/1963 | United Kingdom . |

OTHER PUBLICATIONS

Solid State Hybrid TV Receiver, Sarma, Journal of the Institution of Engineers (India) Electronics & Telecommunication Engr. Div., vol. ET2-3, pp. 75-79, Apr. 1975.

Primary Examiner—John C. Martin
Assistant Examiner—Aristotelis M. Psitos
Attorney, Agent, or Firm—Eugene M. Whitacre; William H. Meagher; W. Brinton Yorks, Jr.

[57] ABSTRACT

An automatic fine tuning (AFT) circuit is provided which generates an AFT control signal in response to a video intermediate frequency (I.F.) signal. The I.F. signal is supplied to the inputs of two buffer amplifiers, which couple signals of like phase relationship to two inputs of a discriminator network. The discriminator network is tuned to the desired frequency of the video I.F. signal, and is responsive to the buffered I.F. signals for causing respective signal voltages to be developed at its inputs which vary differentially in magnitude in response to the frequency deviation of the I.F. signals from the desired I.F. frequency. The differentially related signals are detected by two peak detector networks for use as AFT control signals. The buffer amplifiers and peak detectors may be conveniently fabricated on a single I.C. chip. The discriminator network is coupled to the buffer amplifiers by two external I.C. terminals.

12 Claims, 8 Drawing Figures

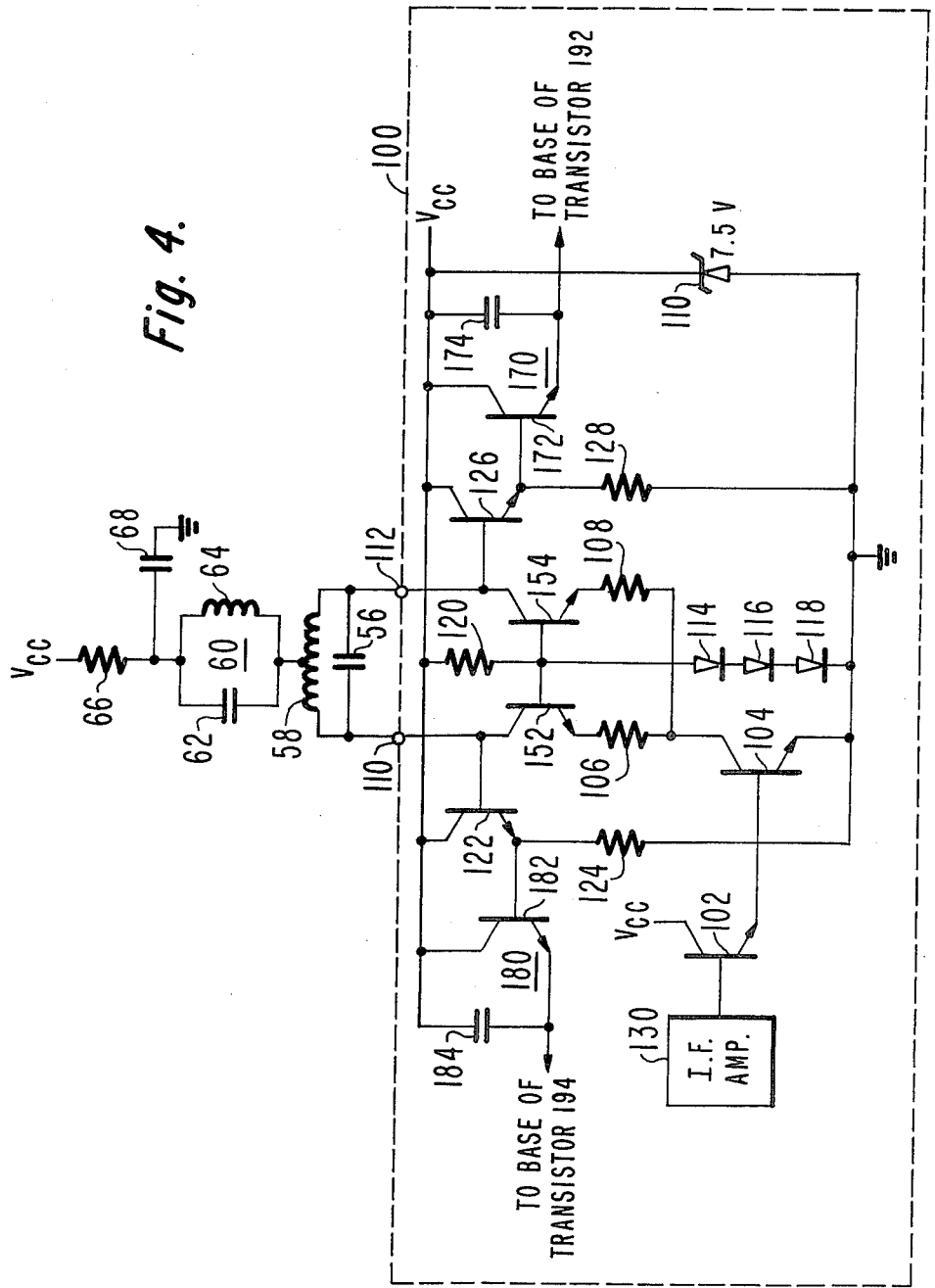

AFT CIRCUIT

This invention relates to automatic frequency control apparatus in general, and, in particular, to such apparatus for deriving a frequency dependent error-correction signal to control the tuning of a local oscillator in a superheterodyne receiver.

It is the function of a television tuner to select a narrow range of frequencies from among the many broadcast frequencies in the radio frequency band. A conventional television tuner performs this function through the use of a radio frequency amplifier, a mixer, and a local heterodyne oscillator. The output of this oscillator is compared to, or beat with, the radio frequency television signal received from the receiver antenna by the mixer. This beating action creates both the sum and difference frequencies of the original radio frequency and local oscillator frequencies. All but the difference frequencies, called intermediate frequencies (I.F.), are filtered out. These I.F. frequencies are amplified and detected by the television receiver to recreate the desired sound and picture information.

In order to provide the optimum image on the television screen, together with accurate sound reproduction, it is necessary that the receiver local oscillator be adjusted so that the picture and sound carriers are located at the correct points in the I.F. passband of the television receiver. This is especially true in the tuning of color television receivers. Not only must the picture and sound carriers be situated at their proper positions in the I.F. passband but the color subcarrier must also be properly positioned in order that the colors will be reproduced by the kinescope with proper hue and saturation characteristics. If the local oscillator is for any reason not set at the proper frequency, the intermediate frequencies will be incorrect, and may deleteriously affect the reproduced sound and picture. As is well known, this mistuning may be due to improper fine tuning by the television viewer, local oscillator drift, or inaccurate resetability of the detenting action of a mechanical tuner. In order to overcome these problems, conventional receivers are provided with means for compensating for variations in the intermediate frequencies.

This compensation is normally accomplished by deriving an automatic fine tuning (AFT) voltage from the output of the I.F. amplifying stage of the receiver. The AFT voltage is representative of the sense and degree that the I.F. signal departs from the desired I.F. signal. The AFT voltage is applied to a voltage responsive reactance device in the local oscillator to correct the mistuning of the oscillator and thereby optimize the sound and picture reproduction.

There are presently two types of AFT circuits in general use: the quadrature detector type and the differential envelope detector type. The quadrature detector type AFT circuit converts frequency shifts of a frequency modulated signal to differentially phase-shifted signals by applying the frequency modulated signal to a filter network, which develops two differentially phase-shifted, or delayed, signals at its output ports. The differentially phase-shifted signals are coupled to a quadrature, or phase, detector, which converts the relative phase difference between the signals at the filter output ports to an amplitude-varying AFT control signal. The differential envelope detector type AFT circuit, such as that described in the present application, utilizes a linear filter network to convert frequency shifts of a frequency modulated signal to differentially related, amplitude varying signals. These signals are coupled to envelope detectors, which convert the amplitude varying signals to AFT control signals. The differential envelope detector AFT circuit generally requires fewer components than the quadrature detector type, and is preferred in many applications because of its ability to produce a narrower, more precisely controlled AFT bandwidth. The narrower bandwidth reduces the effect of I.F. noise on the AFT control system and produces sharper AFT response in the vicinity of the I.F. picture carrier being controlled by the system.

In order to minimize the size and number of components required to construct an AFT circuit, it is desirable to fabricate the circuit in integrated circuit form on a single monolithic integrated circuit chip. However, certain AFT circuit elements, specifically, the reactive components used to construct the discriminator network necessary to convert frequency shifts of the I.F. signal to amplitude modulated signals, do not readily lend themselves to integrated circuit fabrication and must be located external to the I.C. chip. The I.C. chip has only a limited number of external connection points, or terminals, for connection to external components. Hence, it is desirable to construct the AFT circuit in a manner which reduces the number of required connections to external components.

In accordance with the principles of the present invention, an AFT circuit is provided which generates AFT control signals in response to a video I.F. signal. The I.F. signal is supplied to the inputs of two buffer amplifiers, which couple parallel signals of like phase relationship to two inputs of a discriminator network. The discriminator network is tuned to the desired I.F. frequency, and is responsive to the buffered I.F. signals for providing respective signals at its inputs which vary differentially in sense and degree with the frequency deviation of the buffered I.F. signals from the desired I.F. frequency. The differentially related signals are detected by two peak detector networks for use as AFT control signals. The buffer amplifiers and peak detector networks may be conveniently fabricated on a single I.C. chip. The discriminator network is coupled to the buffer amplifiers and peak detectors through two external I.C. terminals.

The peak detected signals may be combined and amplified to produce an AFT signal for application to the local oscillator. However, a circuit with an AFT signal which varies over a fixed voltage range is restricted to operation with local oscillators which respond to the specific voltage range of that circuit. Such an AFT circuit can be used with a wide variety of local oscillators of differing characteristics only if additional interfacing circuitry is interposed between the AFT circuit and the local oscillator. Such interfacing circuitry can add undesirable delays and complexity to the AFT system.

In accordance with a further aspect of the present invention, the detected, differentially related signals are combined by a differential amplifier and coupled to a current mirror circuit to provide an AFT current signal. The current mirror circuit is contained on the same I.C. chip as the buffer amplifiers and detector networks. Through the use of a suitable external load resistor, the AFT current signal may be used to produce a wide variety of AFT voltage ranges. In addition, means are provided for varying the magnitude of the AFT current signal to permit accurate matching of the AFT circuit to the signal requirements of the local oscillator. The magnitude of the AFT current signal may be modified during operation of the television receiver, for example, to provide continuously variable AFT current signal ranges over the full range of television channels.

In the accompanying drawings:

FIG. 4 illustrates, in schematic diagram form, a second embodiment of an AFT circuit constructed in accordance with the principles of the present invention;

Figure 1:
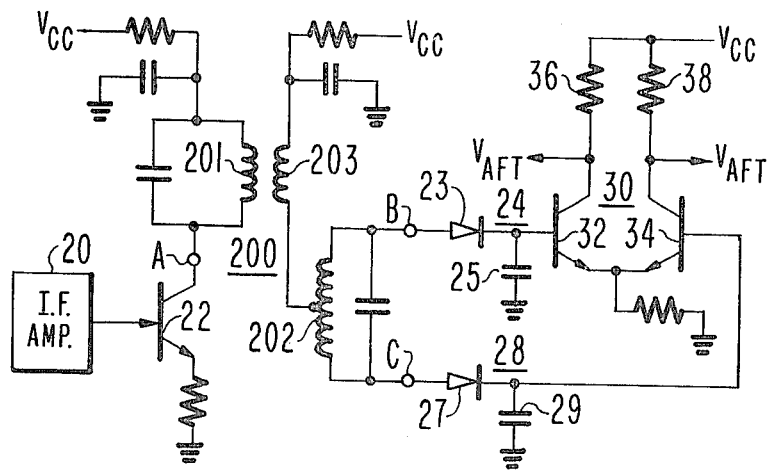
FIG. 1 illustrates a prior art AFT circuit in schematic diagram form.

A typical prior art AFT circuit which is used in the CA3064 TV Automatic Fine Tuning Circuit integrated circuit manufactured by RCA Corporation, Somerville, N.J., is described in U.S. Pat. No. 3,577,008. A simplified schematic circuit diagram of this circuit is illustrated in FIG. 1 of the present application. An I.F. signal including a nominal 45.75 MHz picture carrier is coupled to the base of a buffer amplifier transistor 22 from an I.F. amplifier 20. The collector of transistor 22 is coupled by way of an external I.C. terminal A to the primary winding 201 of a phase shift discriminator transformer 200 which is tuned near the 45.75 MHz video carrier frequency. The secondary winding 202 of the transformer 200 is connected between a pair of external I.C. terminals B and C, and is tuned to the 45.75 MHz carrier frequency. A tertiary winding 203 is connected between a center tap on the secondary winding 202 and a source of supply voltage $V_{CC}$. The discriminator transformer 200, in response to the signal developed by the buffer amplifier transistor 22 at the I.C. terminal A, imparts a phase shift to the signal which is proportional to the frequency difference between the applied signal and the frequency to which the discriminator transformer 200 is tuned (i.e., the center frequency). At center frequency, the amplitudes of the signals developed at the I.C. terminals B and C are equal. Off center frequency, one of the signals increases in amplitude while the other decreases.

The phase shifted signals from the transformer 200 are coupled to two peak detectors 24 and 28 via the I.C. terminals B and C. The peak detectors 24 and 28 are comprised of the p-n junctions of diodes 23 and 27 coupled to two capacitors 25 and 29, respectively. Any frequency deviation of the applied signal from the tuned reference frequency produces a change in the direct voltage stored across capacitor 25, which is equal in magnitude but opposite in polarity to the change in the voltage stored across capacitor 29.

The direct voltages stored by peak detectors 24 and 28 are coupled to two inputs of a differential amplifier 30. The differential amplifier 30 is comprised of two emitter coupled transistors 32 and 34 having collector load resistors 36 and 38, respectively. At the center frequency, equal direct voltages are applied to the bases of transistors 32 and 34. The differential amplifier 30 thus develops equal AFT control voltages at the collector electrodes of transistors 32 and 34. For applied signal frequencies different from the center frequency, differentially related AFT control voltages are produced at the collector electrodes of the differential amplifier transistors 32 and 34. The AFT control voltages are used to control variable reactance circuitry in the local oscillator of the television tuner to adjust the frequency of the oscillator. For example, a varactor diode or similar device may be controlled to adjust the oscillator frequency so as to maintain the intermediate frequency signal at 45.75 MHz, the frequency to which the discriminator transformer 200 is tuned.

Figure 2:
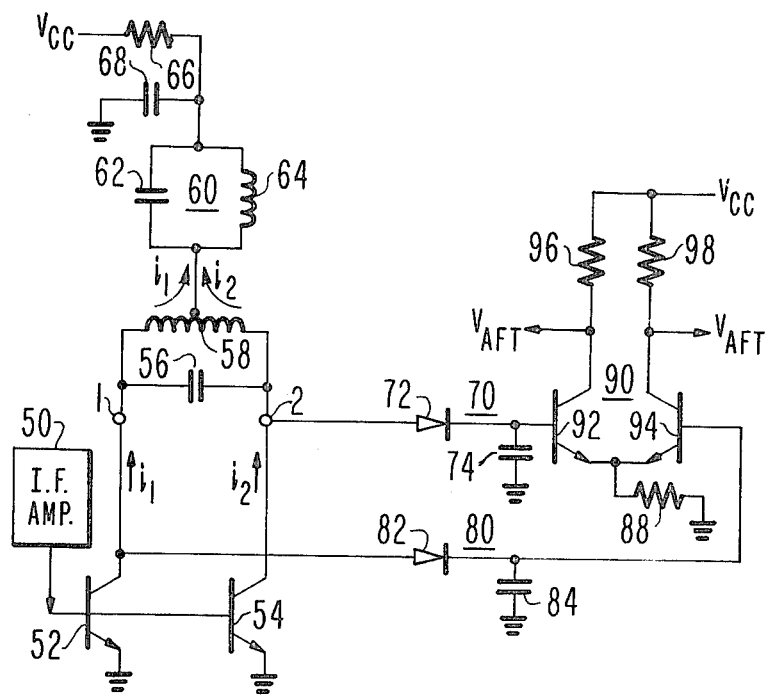
FIG. 2 illustrates, in schematic diagram form, an AFT circuit constructed in accordance with the principles of the present invention.

An AFT circuit constructed in accordance with the principles of the present invention is illustrated in FIG. 2. An I.F. signal including a nominal 45.75 MHz video picture carrier is coupled from an I.F. amplifier 50 to the base electrodes of two buffer transistors 52 and 54, which may be located on an integrated circuit chip. The emitter electrodes of the buffer transistors 52 and 54 are coupled to ground, and their collector electrodes are coupled to external I.C. terminals 1 and 2, respectively.

A discriminator network which is tuned to the desired picture carrier frequency of 45.75 MHz is coupled to the buffer transistors 52 and 54. The parallel combination of a capacitor 56 and an inductor 58 which is tuned to resonate at the desired I.F. frequency is coupled across external I.C. terminals 1 and 2. A second parallel combination 60 of an inductor 64 and a capacitor 62, also tuned to the desired picture carrier frequency, is coupled to an intermediate point of inductor 58 from one junction of the capacitor 62 and the inductor 64. The other junction of the capacitor 62 and the inductor 64 is coupled to a source of supply voltage $V_{CC}$ by a resistor 66, and to ground by a shunt capacitor 68.

External I.C. terminals 1 and 2 are coupled internally to two peak detectors 70 and 80, respectively, which may be located on the same I.C. chip as buffer transistors 52 and 54. The peak detector 70 is comprised of a diode 72 having an anode electrode coupled to terminal 2 and a cathode electrode coupled to ground by a peak detecting capacitor 74. The peak detector 80 is similarly comprised of a diode 82 having an anode electrode coupled to terminal 1 and a cathode electrode coupled to ground by a peak detecting capacitor 84.

The peak detectors 70 and 80 are coupled to two inputs of a differential amplifier 90 which is comprised of two transistors 92 and 94. The cathode electrode of diode 72 is coupled to the base electrode of transistor 92 and the cathode electrode of diode 82 is coupled to the base electrode of transistor 94. The emitter electrodes of transistors 92 and 94 are coupled together and to ground by a resistor 88. Reciprocally varying AFT control voltages are developed at the collectors of transistors 92 and 94, which are coupled to the $V_{CC}$ supply by resistors 96 and 98, respectively.

When the I.F. input signal is applied to the bases of buffer transistors 52 and 54, signal currents $i_1$ and $i_2$ of like phase are developed at the collector electrodes of these transistors and are coupled to the discriminator network by I.C. terminals 1 and 2. These currents flow into opposite ends of inductor 58 and are coupled to tuned circuit 60 by the intermediate tap connection. A D.C. path for these currents is established by inductor 64 and resistor 66, which are coupled to supply voltage $V_{CC}$.

By proper selection of the intermediate tap position of inductor 58, the magnetic fields produced by the flow of signal currents $i_1$ and $i_2$ through inductor 58 are balanced and cancel, resulting in no net voltage across inductor 58 due to $i_1$ and $i_2$. However, the flow of signal currents $i_1$ and $i_2$ through inductor 64 does produce a net voltage across tuned circuit 60. The energy thus produced in tuned circuit 60 is coupled back to inductor 58 by mutual magnetic coupling, as illustrated in FIG. 2, to produce voltages at terminals 1 and 2 which vary with the deviation of the I.F. picture carrier frequency from the frequency to which tuned circuit 60 is tuned. The two voltages vary differentially, with one increasing as the other decreases. (Alternatively, unbalanced capacitive coupling may be used to couple tuned circuit 60 to inductor 58, by connecting a small capacitor between one end of the inductor 58 and ground.)

The differentially related voltages developed at terminals 1 and 2 are coupled to peak detectors 80 and 70, respectively, where they are peak detected across capacitors 84 and 74. The peak detected voltages are applied to the two inputs of differential amplifier 90, where they are amplified to produce differentially varying AFT control voltages at the collectors of transistors 92 and 94.

Figure 3A:
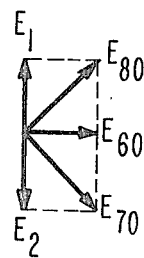
FIGS. 3a and 3b illustrate graphically the phase-related voltages developed by the circuit shown in FIG. 2.
Figure 3B:
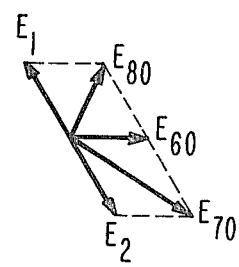

The voltages developed by the circuit shown in FIG. 2 are represented graphically in the phasor diagrams of FIGS. 3a and 3b. The voltage which is applied to peak detector 80, $E_{80}$, is the vector sum of the voltage across tuned circuit 60, $E_{60}$, and the voltage developed across approximately half of inductor 58, $E_1$. The voltage applied to peak detector 70, $E_{70}$, is similarly the sum of $E_{60}$ and the voltage developed across the other half of inductor 58, $E_2$. When the I.F. picture carrier is at the resonant frequency of the discriminator network, $E_1$ leads $E_{60}$ by 90 degrees, and $E_2$ lags $E_{60}$ by 90 degrees. The resultant voltages $E_{80}$ and $E_{70}$ then have equal magnitudes, as seen in FIG. 3a.

FIG. 3b shows the phasor diagram for the case where the I.F. picture carrier frequency is less than the resonant frequency of the discriminator network. In this case, $E_1$ leads $E_{60}$ by more than 90 degrees, and $E_2$ lags $E_{60}$ by less than 90 degrees. This results in an increase in the magnitude of voltage $E_{70}$, and a decrease in the magnitude of voltage $E_{80}$. It may be appreciated that an equal and opposite result will obtain for the case where the I.F. picture carrier frequency is greater than the resonant frequency of the discriminator network, causing $E_{80}$ to be greater than $E_{70}$.

Figure 5:
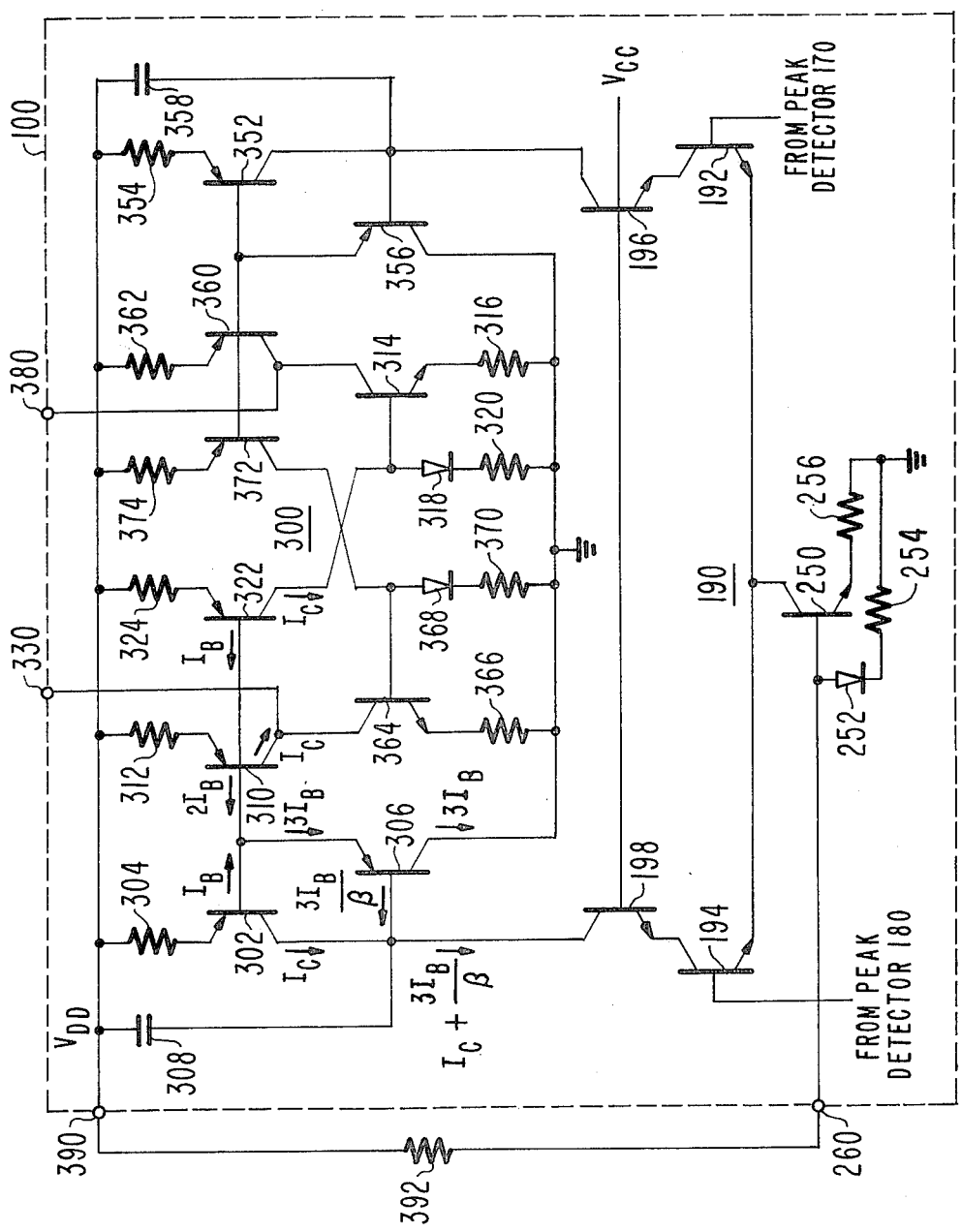
FIG. 5 illustrates, in schematic diagram form, a differential amplifier and current mirror circuit suitable for operation in conjunction with the AFT circuit of FIG. 4.

An alternative embodiment of the concepts of the present invention is illustrated in FIGS. 4 and 5. Referring first to FIG. 4, an AFT circuit suitable for substantial fabrication in monolithic integrated circuit form is shown, including an externally located discriminator network. The AFT circuit receives I.F. input signals from an I.F. amplifier 130, which may be located on the same I.C. chip 100 as the AFT circuit, or may be externally located. The I.F. input signals are applied to the base electrode of a transistor 102, which has a collector electrode coupled to a source of supply voltage $V_{CC}$ and an emitter electrode coupled to the base electrode of a transistor 104. Transistor 104 has an emitter electrode coupled to a source of reference potential (ground) and supplies I.F. current signals from its collector electrode to the emitter electrodes of buffer transistors 152 and 154 through resistors 106 and 108, respectively. Transistors 152 and 154 are arranged in similar common base configurations, and are biased by the couplings of their base electrodes to the junction of a resistor 120 and a diode 114. Resistor 120 provides bias current from supply voltage source $V_{CC}$, and diode 114, together with diodes 116 and 118, maintains the voltage at the bases of transistors 152 and 154 at three base-to-emitter voltage drops (3 $V_{be}$'s) above ground by their forward biased, serial coupling from resistor 120 to ground.

Amplified I.F. input signals of like phase are coupled to external I.C. terminals 110 and 112 from the collector electrodes of buffer transistors 152 and 154, respectively. A discriminator network identical to that shown in FIG. 2 is coupled across external I.C. terminals 110 and 112. For ease of description, the discriminator network of FIG. 4 bears the same reference numerals as the discriminator network of FIG. 2 and will not be discussed in further detail.

The voltage developed at terminal 110 by mutual magnetic coupling, or, alternatively, unbalanced capacitive coupling (not shown) from the external discriminator network is coupled to the base electrode of an emitter follower transistor 122, which has a collector electrode coupled to the $V_{CC}$ supply, and an emitter electrode coupled to ground by a resistor 124. A transistor 182 has a base electrode coupled to the emitter electrode of transistor 122, a collector electrode coupled to the $V_{CC}$ supply and a capacitor 184 coupled from its emitter electrode to its collector electrode. Transistor 182 and capacitor 184 comprise a peak detecting circuit 180, which peak detects the voltage developed at terminal 110 by the discriminator network. The peak detecting capacitor 184 is referenced to the $V_{CC}$ supply rather than ground to confine the peak detecting capacitor charging current to the small loop containing transistor 182 and capacitor 184. When the peak detecting capacitor is referenced to ground, the charging current loop includes the entire power supply path from ground back to the $V_{CC}$ supply, which can introduce noise problems into the circuit. The present peak detecting circuit 180 obviates these problems by charging peak detecting capacitor 184 down from the $V_{CC}$ supply to the peak detected voltage level at the emitter electrode of transistor 182.

A similar emitter follower transistor 126 and peak detecting circuit 170 are coupled to external I.C. terminal 112 to peak detect the voltage developed at that point by the discriminator network. Since these circuit elements operate in an identical manner to transistor 122 and peak detecting circuit 180, further discussion of these components will be omitted.

Referring to FIG. 5, the peak detected signals are coupled to the inputs of a differential amplifier 190. The peak detected level stored by capacitor 174 is coupled to the base of a transistor 192 and the level stored by capacitor 184 is coupled to the base of a transistor 194. The emitter electrodes of transistors 192 and 194 are coupled together and to the collector of a current source transistor 250. The emitter electrode of transistor 250 is coupled to ground by a resistor 256. The base electrode of transistor 250 is coupled to the anode electrode of a diode 252 and to an external I.C. terminal 260. The cathode electrode of diode 252 is coupled to ground by a resistor 254. By proper selection of the values of resistors 254 and 256, current applied to terminal 260 will flow through diode 252 and resistor 254 and will be replicated through the collector-to-emitter path of transistor 250.

The differentially related signals developed at the collectors of transistors 192 and 194 are stepped up in voltage level by transistors 196 and 198. The emitter electrode of transistor 196 is coupled to the collector electrode of transistor 192, and the emitter electrode of transistor 198 is coupled to the collector electrode of transistor 194. The base electrodes of transistors 196 and 198 are coupled to the $V_{CC}$ supply. The amplified, differentially related signals at the collectors of transistors 196 and 198 are coupled to two inputs of a current mirror output circuit 300.

The current mirror 300 is comprised of identical circuit halves which provide differentially varying output currents at external I.C. terminals 330 and 380. Circuit elements 302-324 on the left side of FIG. 5 correspond directly to circuit elements 352-374 on the right side of the FIGURE. To simplify the discussion of the current mirror 300, only the circuit elements 302-324 on the left side of FIG. 3 will be described in detail, but it is to be understood that this description applies equally to corresponding circuit elements 352-374.

The collector electrode of transistor 198 is coupled to the junction of a capacitor 308, the collector electrode of a transistor 302, and the base electrode of a transistor 306. The emitter electrode of transistor 302 is coupled by a resistor 304 to a source of supply voltage $V_{DD}$, as is the second plate of capacitor 308. The $V_{DD}$ supply voltage is normally selected to be compatible with the voltage supply in the local oscillator to which the AFT currents at terminals 330 and 380 are applied. The emitter electrode of transistor 306 is coupled to the base electrodes of transistors 302, 310 and 322. The collector electrode of transistor 306 is coupled to ground.

Output transistor 310 has a collector electrode coupled to an external I.C. terminal 330 and to the collector electrode of a transistor 364. The emitter electrode of transistor 310 is coupled to the $V_{DD}$ supply by a resistor 312. Transistor 322 has an emitter electrode coupled to the $V_{DD}$ supply by a resistor 324 and a collector electrode coupled to the anode electrode of a diode 318 and the base electrode of a transistor 314. The cathode electrode of diode 318 is coupled to ground by a resistor 320, and the emitter electrode of transistor 314 is coupled to ground by a resistor 316. The collector electrode of transistor 314 is coupled to external I.C. terminal 380 and to the collector of output transistor 360.

Ideally, the collector current of transistor 198 should be replicated by the current mirror 300 and reproduced by the collectors of transistors 310 and 322. A simplified current mirror which would produce near identical current replication comprises the above-described circuit elements, with transistor 306 replaced with a direct connection from the base to the collector of transistor 302. However, such an arrangement will result in erroneous collector currents in transistors 310 and 322 when the current mirror is constructed with relatively low $\beta$ (gain) PNP transistors. As FIG. 5 illustrates, the path to the emitter electrode of transistor 306 must conduct the base currents of transistors 302, 310 and 322 ($3I_B$). When transistor 306 is replaced with a direct connection between the base and collector of transistor 302, the collector current of transistor 198 is the sum of the collector current of transistor 302, $I_C$, plus the three base currents of transistors 302, 310, and 322, which is $3I_B$. When transistors 302, 310 and 322 are low $\beta$ transistors, the three base currents are significant when compared with current $I_C$, and the respective collector currents $I_C$ of transistors 310 and 322 will differ from the collector current of transistor 198, which is $I_C+3I_B$.

But when the current mirror 300 is constructed with transistor 306 as the base current source for transistors 302, 310, and 322, the $3I_B$ current error is substantially reduced. This is because the $3I_B$ base currents are conducted by the emitter-to-collector path of transistor 306, which requires a base current of only $3I_B/\beta$, where $\beta$ is the gain of transistor 306. Thus, the $3I_B$ difference between the respective collector currents of transistors 310 and 322, and the collector current of transistor 198 is reduced to a difference of $3I_B/\beta$. When the $\beta$ of transistor 306 is ten, for example, it can be seen that the $3I_B$ current error is reduced by an order of magnitude, to $0.3I_B$. This circuit is known as a "$\beta^2$ current mirror", since its accuracy can be matched in a circuit that replaces transistor 306 with a direct connection if the gains of transistors 302, 310 and 322 are the square of the $\beta$'s of the transistors used in the present circuit.

The output AFT currents developed at external I.C. terminals 330 and 380 vary differentially; the output current at I.C. terminal 330 is equal to the collector current of transistor 198 less the collector current of transistor 196, and the output current at I.C. terminal 380 is equal to the collector current of transistor 196 less the collector current of transistor 198. It is seen from FIG. 5 that the collector current of transistor 198 is replicated by current mirror transistors 302, 306 and 310 to produce an essentially identical collector current in transistor 310. The collector current of transistor 196 is likewise replicated by transistors 352, 356, and 372 to produce a virtually identical collector current in transistor 372. The collector current of transistor 372 is conducted by diode 368, which is arranged in a high gain, NPN current mirror configuration with transistor 364, to produce a matching collector current in transistor 364. Thus, the output AFT current provided at I.C. terminal 330 is equal to the difference between the collector currents of transistors 310 and 364, which is equal to the difference between the collector currents of transistors 198 and 196. The output AFT current provided at I.C. terminal 380 is likewise equal to the difference between the collector currents of transistors 360 and 314, which is equal to the difference between the collector currents of transistors 196 and 198.

When the frequency of the input I.F. signal provided by I.F. amplifier 130 in FIG. 4 is equal to the resonant frequency of the tuned circuit 60, identical voltages are developed by the discriminator network at external I.C. terminals 110 and 112. These voltages are detected by peak detectors 180 and 170 and applied to the inputs of differential amplifier 190. This results in the flow of substantially identical collector currents in transistors 196 and 198, and their difference produces no AFT output currents at I.C. terminals 330 and 380. However, when the input I.F. signal shifts away from the frequency of the tuned circuit 60, the differentially varying voltages which are developed at external I.C. terminals 110 and 112 and detected by peak detectors 180 and 170 result in the generation of differentially related collector currents in transistors 196 and 198. These collector currents are combined by current mirror 300, causing a flow of current of one polarity at one of the I.C. terminals 330 or 380, and an equal current flow of opposite polarity at the other I.C. terminal.

These AFT currents may be used to alter the reactance of a variable reactance tuning element in the local oscillator of the television tuner.

The magnitudes of the AFT output currents corresponding to various shifts in I.F. frequency are controlled by the current mirror comprising diode 252 and transistor 250, which is the source of supply current for differential amplifier 190. When an input current is supplied to external I.C. terminal 260, it is conducted to ground by diode 252 and replicated in the collector of transistor 250. The collector current of transistor 250 is divided by differential amplifier transistors 192 and 194 and coupled to transistors 196 and 198, where the divided currents appear at the collectors of transistors 196 and 198. Thus, the total current supplied to current mirror 300 is controlled by the current applied to I.C. terminal 260, and the magnitudes of the AFT output currents are controlled accordingly.

It was found that, with current mirror 300 operating over a wide range of current outputs, the two loops defined by transistors 302 and 306, and transistors 352 and 356, had a tendency to oscillate under certain signal and load conditions. To prevent these undesirable oscillations, capacitors 308 and 358 were added across the emitter-to-collector paths of transistors 302 and 352, respectively. These capacitors prevent oscillations in the respective transistor loops by creating a single dominant pole in the root-locus plots of the loop transfer functions, thereby stabilizing the operation of current mirror 300.

Figure 6:
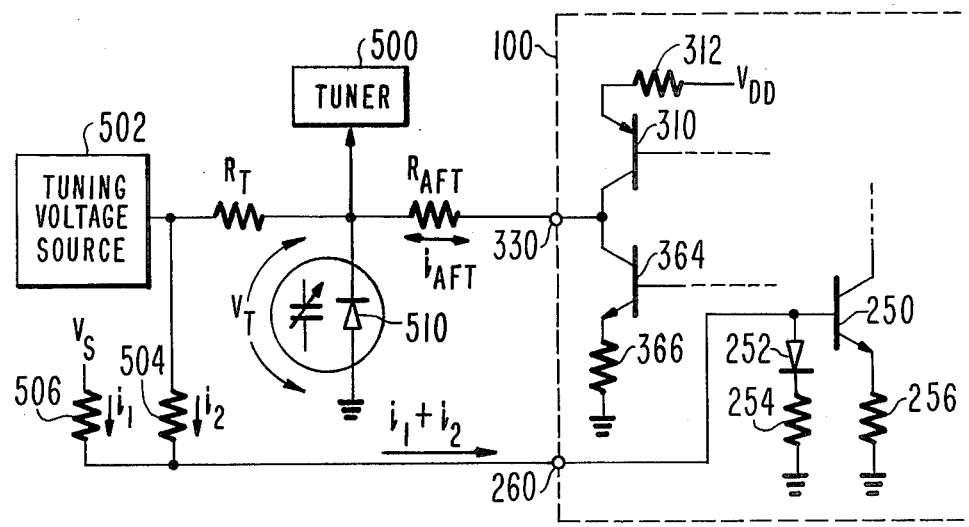
FIG. 6 illustrates, partially in schematic diagram form and partially in block diagram form, a circuit arrangement for supplying a continuously varying AFT signal to a reactive element in a local oscillator.

The AFT circuit described in conjunction with FIGS. 4 and 5 may be used to vary the capacitance of a tuning varactor diode in a television receiver as illustrated in FIG. 6. Referring to that FIGURE, integrated circuit 100 of FIGS. 4 and 5 is partially illustrated, with only the internal circuit elements connected to external I.C. terminals 330 and 260 shown in schematic detail. In this embodiment of the present invention, only one AFT output I.C. terminal (330) is used. The other terminal (380) remains unconnected.

A tuning voltage for a varactor diode 510 is provided by a tuning voltage source 502. The tuning voltage varies in accordance with the selected channel to which the television receiver is tuned. The voltage supplied by tuning voltage source 502, $V_T$, is coupled through a resistance $R_T$ and applied to the cathode electrode of varactor diode 510. The tuning voltage is also coupled to a resistor 504 to produce a current $i_2$, which is coupled to I.C. terminal 260 of the integrated circuit 100. Current $i_2$ is combined with a constant current $i_1$ which is coupled from a voltage source $V_S$ to terminal 260 by a resistor 506. The sum of currents $i_1$ and $i_2$ are conducted to ground by diode 252 and resistor 254 to produce a collector current in transistor 250 which is equal to the sum of $i_1 + i_2$. The collector current $i_1$ and $i_2$ of transistor 250 is divided by differential amplifier 190 as previously described to produce a differential output AFT current $i_{AFT}$ at external I.C. terminal 330. The AFT current $i_{AFT}$ is coupled through a resistance $R_{AFT}$ to develop an AFT control voltage component across $R_T$ at the cathode electrode of varactor diode 510. The varactor diode 510 will therefore exhibit a capacitance which is determined by the net voltage resulting from the tuning and AFT voltages applied at its cathode electrode with respect to ground. This capacitance is coupled to a tuner 500 to tune the local oscillator contained therein to the correct frequency for I.F. signal demodulation.

Figure 7:
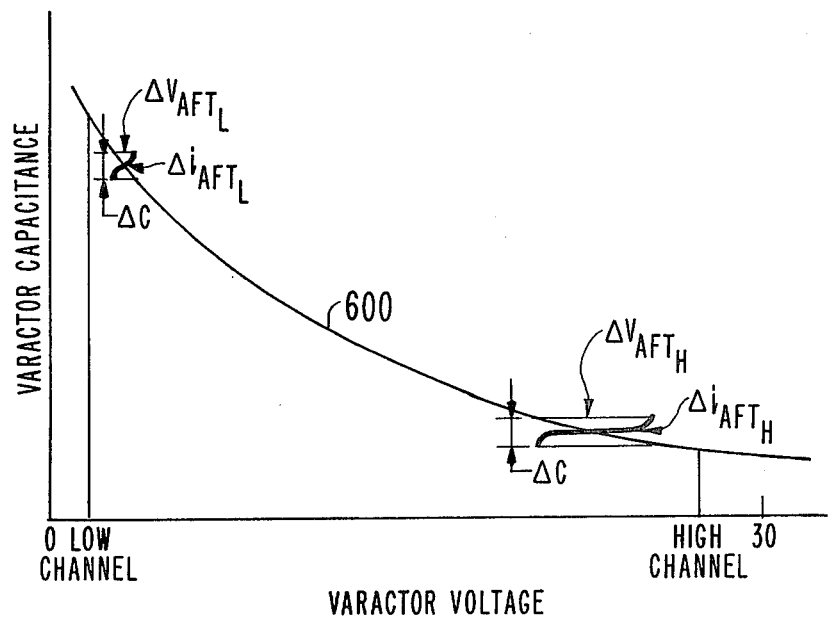
FIG. 7 illustrates graphically the effect of AFT control on the reactive element of FIG. 6.

The capacitance of the varactor diode 510 does not change linearly with applied voltage, but varies nonlinearly, as illustrated by curve 600 in FIG. 7. As this FIGURE indicates, at a lower channel, a small voltage change $\Delta V_{AFTL}$ results from a small swing in output AFT current $\Delta i_{AFTL}$, creating a change over a range $\Delta C$ in varactor diode capacitance. However, in order to develop the same capacitance swing $\Delta C$ at higher channels, the output AFT current must have a higher swing $\Delta i_{AFTH}$, to create a large AFT voltage swing $\Delta V_{AFTH}$. The circuit arrangement of FIG. 6 will have this characteristic, for as the television receiver is switched to higher channels, the tuning voltage and the current $i_2$ provided by tuning voltage source 502 increase. The sum of currents $i_1$ and $i_2$ will increase, thereby supplying more current to I.C. terminal 260 and the current mirror comprised of diode 252 and transistor 250. The collector current supplied by transistor 250 to the differential amplifier 190 will therefore increase, which increases the magnitude of the output AFT current $i_{AFT}$. The larger AFT current $i_{AFT}$ will produce a greater AFT voltage swing at the cathode electrode of varactor diode 510, allowing the capacitance of the varactor diode to be varied over a substantially constant range of capacitance values $\Delta C$. Thus, the capacitance coupled to the tuner 500 may be varied by the AFT circuit over a virtually constant range of changing limits as the television receiver is tuned from channel to channel.

While the AFT circuit of the present invention may be advantageously used in an embodiment such as that illustrated in FIG. 6, in which the range of magnitudes of the output AFT current is varied by changing the current applied to I.C. terminal 260, the circuit may be readily used in an application which requires a fixed AFT signal range. For example, an embodiment of the AFT circuit of the present invention can be used to provide the AFT signal for the television receiver described in RCA Service Data 1978 No. C-2 for a CTC-87 type receiver, published by RCA Corporation, Indianapolis, Ind., which utilizes a fixed AFT signal range. The AFT circuit of FIG. 6 will produce an output AFT signal with a predetermined range of current magnitudes when a fixed current source is applied to external I.C. terminal 260. This may be accomplished by connecting an external resistor 392 from the $V_{DD}$ supply terminal 390 to terminal 260. The external resistor 392 will conduct a constant current to diode 252 and transistor 250, thereby providing a constant emitter current for division by differential amplifier 190. The range of current magnitudes is determined by the value selected for the external resistor 392, which permits the AFT output current signal to be precisely matched to the requirements of the tuner which is being controlled by the AFT signal.

What is claimed is:

1. In an automatic fine tuning circuit including an integrated circuit chip having first and second contact areas for coupling to discrete circuit elements located external to said integrated circuit chip, apparatus comprising:

means located on said integrated circuit chip for supplying input signals having a frequency within a band including a predetermined reference frequency to said first and second contact areas;

a discriminator network, located external to said integrated circuit chip and coupled to said first and second contact areas, and responsive to said input signals for providing respective signals at said first and second contact areas which vary differentially in magnitude in response to the frequency deviation of said input signals from said reference frequency; and first and second detector networks located on said integrated circuit chip and having respective input terminals direct current coupled to said first and second contact areas for detecting the magnitudes of said differentially varying signals.

2. In a television receiver, including a source of tuning voltage, and a tuner, including a reactive element responsive to said tuning voltage and an automatic frequency control signal, for producing a mixing signal to convert radio frequency television signals to intermediate frequency television signals within a band including a predetermined reference frequency, an automatic frequency control signal generator comprising:

first and second amplifiers, each having an input terminal for receiving a common intermediate frequency television signal having a frequency within a band including said predetermined reference frequency and an output terminal; said amplifiers supplying respective signal currents of like phase relationship to said output terminals in response to said common input signal;

a discriminator network coupled to said output terminals of said first and second amplifiers for causing respective signal voltages developed at said output terminals of said first and second amplifiers to vary differentially in magnitude in response to the frequency deviation of said intermediate frequency television signal from said reference frequency;

first and second detector networks respectively coupled to said output terminals of said first and second amplifiers for detecting the magnitudes of said differentially varying signal voltages;

a differential amplifier for developing output signals which vary differentially in sense and magnitude in response to the magnitudes of the signals detected by said first and second detector networks; and means coupled to said differential amplifier for combining said output signals to develop an automatic frequency control signal which varies in sense and magnitude in response to the frequency deviation of said intermediate frequency signal from said predetermined reference frequency, wherein said amplifiers, said detector networks, said differential amplifier, and said combining means and couplings therebetween are realized in integrated circuit form on a common monolithic integrated circuit chip, wherein each of said output terminals comprises an external connection terminal of said integrated circuit chip, wherein said discriminator network comprises components separate from said chip and coupled to said chip terminals, and wherein said automatic frequency control signal is coupled to said reactive element at a third chip terminal to control the frequency of said mixing signal.

3. The automatic frequency control signal generator of claim 2, further comprising:

a controllable current source having an input responsive to said tuning voltage and having an output coupled to said differential amplifier for varying the magnitude of the sum of said output signals for a given deviation of said intermediate frequency signals from said reference frequency, wherein said current source is located on said integrated circuit chip and said input is coupled to a fourth chip terminal to receive said tuning voltage.

4. In an automatic frequency control signal circuit including an integrated circuit chip having first, second and third contact areas for coupling to discrete circuit elements located external to said integrated circuit chip, apparatus comprising:

means located on said integrated circuit chip for supplying input signals having a frequency within a band including a predetermined reference frequency to said first and second contact areas;

a discriminator network, located external to said integrated circuit chip and coupled to said first and second contact areas, and responsive to said input signals for providing respective signals at said first and second contact areas which vary differentially in magnitude in response to the frequency deviation of said input signals from said reference frequency;

first and second detector networks located on said integrated circuit chip and having respective input terminals coupled to said first and second contact areas for detecting the magnitudes of said differentially varying signals;

a differential amplifier located on said integrated circuit chip and coupled to said detector networks for developing output signals which vary differentially in sense and magnitude in response to the detected magnitudes of said differentially varying signals; and means located or said integrated circuit chip and coupled to said differential amplifier for combining said output signals to develop an automatic frequency control signal at said third contact area which varies in sense and magnitude in response to the frequency deviation of said input signals from said predetermined reference frequency.

5. The automatic frequency control signal circuit of claim 4, further comprising:

a controllable current source located on said integrated circuit chip and having an input coupled to a fourth contact area and an output coupled to said differential amplifier; and means external to said integrated circuit chip and coupled to said fourth contact area for varying the magnitude of the sum of said output signals for a given deviation of said input signals from said predetermined reference frequency.

6. Frequency discriminating apparatus comprising:

means for supplying input signals having a frequency within a band including a predetermined reference frequency;

a discriminator network, coupled to said input signal means, which provides respective signals which vary differentially in magnitude in response to the frequency deviation of said input signals from said reference frequency;

means for detecting the respective magnitudes of said discriminator network signals;

an amplifier coupled to said detecting means for developing first and second output currents respectively representative of said respective signal magnitudes;

means for combining said first and second output currents to develop a difference current which is related in sense and magnitude to the frequency deviation of said input signals from said reference frequency; and a controllable current source coupled to said amplifier for controlling the magnitude of the sum of said first and second output currents for a given frequency deviation of said input signals from said reference frequency.

7. Frequency discriminating apparatus comprising:
means for supplying input signals having a frequency within a band including a predetermined reference frequency;
a discriminator network, coupled to said input signal means, which provides respective signals which vary differentially in magnitude in response to the frequency deviation of said input signals from said reference frequency;
means for detecting the respective magnitudes of said discriminator network signals;
an amplifier coupled to said detecting means for developing first and second output currents respectively representative of said respective signal magnitudes;
means for combining said first and second output currents to develop a difference current which is related in sense and magnitude to the frequency deviation of said input signals from said reference frequency; and
first and second transistors each disposed in a common base amplifier configuration to receive one of said respective output currents from said amplifier and having respective output electrodes coupled to said current combining means.

8. Frequency discriminating apparatus comprising:
means for supplying input signals having a frequency within a band including a predetermined reference frequency;
first and second terminals;
first and second transistors each having an input electrode coupled to said input signal supplying means and respective output electrodes coupled to said first and second terminals for supplying signals of like phase relationship at said terminals;
a discriminator network coupled to said first and second terminals for causing the signals developed at said first and second terminals to vary differentially in magnitude in response to the frequency deviation of said input signals from said reference frequency;
means for detecting the magnitudes of said differentially varying signals; and
a differential amplifier responsive to the detected magnitudes of said differentially varying signals for developing an output signal which varies in sense and magnitude in response to the frequency deviation of said input signals from said reference frequency,
wherein said discriminator network is tuned to said reference frequency and comprises:
a first parallel combination of a capacitor and an intermediate tapped inductor, coupled between said first and second terminals; and
a second parallel combination of a capacitor and an inductor, coupled between said intermediate tap of said inductor of said first parallel combination, and a source of supply voltage.

9. In a television receiver, automatic frequency control apparatus for providing an automatic frequency control signal which varies in response to the frequency deviation of an intermediate frequency signal from a predetermined reference frequency, comprising:
means responsive to said intermediate frequency signal for providing first and second input signals of like phase relationship;
a discriminator network, coupled to said input signal means, and responsive to said first and second input signals, for causing said input signals to vary differentially in magnitude in response to the frequency deviation of said input signals from said reference frequency;
means coupled to the junction of said input signal means and said discriminator network for detecting the magnitudes of said differentially varying signals;
a differential amplifier coupled to said detecting means for developing output signals which vary in sense and magnitude in response to the detected magnitudes of said differentially varying signals; and
a current mirror circuit coupled to said differential amplifier for combining said output signals to develop an automatic frequency control signal which varies in sense and magnitude in response to the frequency deviation of said intermediate frequency signal from said predetermined reference frequency, wherein said automatic frequency control signal may be used to control the frequency of said intermediate frequency signal.

10. The automatic frequency control apparatus of claim 9, further comprising:
a controllable current source coupled to said differential amplifier and having an input for controlling the magnitude of the sum of the output signals developed by said differential amplifier for a given deviation of said intermediate frequency signal from said reference frequency.

11. In a television receiver, including a source of tuning voltage, and a tuner, including a reactive element responsive to said tuning voltage and an automatic frequency control signal, for producing a mixing signal to convert radio frequency television signals to intermediate frequency television signals within a band including a predetermined reference frequency, an automatic frequency control signal generator comprising:
means responsive to said intermediate frequency signals for developing signals which vary differentially in magnitude in response to the frequency deviation of said intermediate frequency signals from said reference frequency;
a differential amplifier for developing output signals which vary differentially in sense and magnitude in response to the magnitudes of the signals developed by said differential signal means; and
means coupled to said differential amplifier for combining said output signals to develop an automatic frequency control signal which varies in sense and magnitude in response to the frequency deviation of said intermediate frequency signal from said predetermined reference frequency, wherein said automatic frequency control signal is coupled to said reactive element to control the frequency of said mixing signal.

12. The automatic frequency control signal generator of claim 11, further comprising:
a controllable current source responsive to said tuning voltage and having an output coupled to said differential amplifier for varying the magnitude of the sum of said output signals for a given deviation of said intermediate frequency signals from said reference frequency.

* * * * *